(12) United States Patent
Komatani

(10) Patent No.: US 9,396,928 B2
(45) Date of Patent: Jul. 19, 2016

(54) METHOD FOR FABRICATING SEMICONDUCTOR DEVICE

(71) Applicant: SUMITOMO ELECTRIC DEVICE INNOVATIONS, INC., Yokohama-shi, Kanagawa (JP)

(72) Inventor: Tsutomu Komatani, Yokohama (JP)

(73) Assignee: SUMITOMO ELECTRIC DEVICE INNOVATIONS, INC., Yokohama-shi (JP)

( * ) Notice: Subject to any disclaimer, the term of this patent is extended or adjusted under 35 U.S.C. 154(b) by 0 days.

(21) Appl. No.: 14/989,462

(22) Filed: Jan. 6, 2016

(65) Prior Publication Data

US 2016/0118240 A1    Apr. 28, 2016

Related U.S. Application Data

(62) Division of application No. 13/853,742, filed on Mar. 29, 2013, now abandoned.

(30) Foreign Application Priority Data

Mar. 30, 2012   (JP) ................................. 2012-081797

(51) Int. Cl.
   *H01L 21/337*   (2006.01)
   *H01L 21/02*    (2006.01)
   *H01L 29/66*    (2006.01)

(52) U.S. Cl.
   CPC ........ *H01L 21/0217* (2013.01); *H01L 21/0228* (2013.01); *H01L 21/02164* (2013.01); *H01L 21/02178* (2013.01); *H01L 29/66462* (2013.01); *H01L 29/66924* (2013.01)

(58) Field of Classification Search
   CPC .................................................. H01L 21/337
   See application file for complete search history.

(56) References Cited

U.S. PATENT DOCUMENTS

| | | | |
|---|---|---|---|
| 2005/0258431 | A1 | 11/2005 | Smith et al. |
| 2006/0220063 | A1 | 10/2006 | Kurachi et al. |
| 2010/0159656 | A1 | 6/2010 | Nakata et al. |
| 2010/0317164 | A1 | 12/2010 | Komatani |
| 2013/0134555 | A1 | 5/2013 | Kurachi |

FOREIGN PATENT DOCUMENTS

| | | | |
|---|---|---|---|
| JP | 2006-278812 | A | 10/2006 |
| JP | 2007-73556 | A | 3/2007 |
| JP | 2008-500732 | A | 1/2008 |
| JP | 2009-200306 | A | 9/2009 |
| JP | 2010-166040 | A | 7/2010 |

OTHER PUBLICATIONS

Office Action dated Jan. 19, 2016, issued in counterpart Japanese Patent Application No. 2012-081797, with English translation. (6 pages).

*Primary Examiner* — Marvin Payen
(74) *Attorney, Agent, or Firm* — Westerman, Hattori, Daniels & Adrian, LLP

(57) ABSTRACT

A method for fabricating a semiconductor device includes: forming a first film on a nitride semiconductor layer so as to contact the nitride semiconductor layer and have a thickness equal to or larger than 1 nm and equal to or smaller than 5 nm, the first film being made of silicon nitride having a composition ratio of silicon to nitrogen larger than 0.75, silicon oxide having a composition ratio of silicon to oxygen larger than 0.5, or aluminum; and forming a source electrode, a gate electrode and a drain electrode on the nitride semiconductor layer.

16 Claims, 18 Drawing Sheets

FIG. 7A

| 1st source gas | 2nd source gas | | 1st film 34 | | | | |
|---|---|---|---|---|---|---|---|
| | | | supply time (sec) | 1st exhaust time (sec) | nitridization time (sec) | 2nd exhaust time (sec) | number of cycles |
| BTBAS | | | 0.03-0.5 | 2-60 | 0-0.1 | 0-15 | 30 |
| | NH3 plasma or N2 plasma | | 2nd film 36 | | | | |
| | | | supply time (sec) | 1st exhaust time (sec) | nitridization time (sec) | 2nd exhaust time (sec) | number of cycles |
| | | | 0.03-0.5 | 2-30 | 0.2-5 | 2-15 | 1800 |

FIG. 7B

| 1st source gas | 2nd source gas | | 1st film 34 | | | | |
|---|---|---|---|---|---|---|---|
| | | | supply time (sec) | 1st exhaust time (sec) | nitridization time (sec) | 2nd exhaust time (sec) | number of cycles |
| TDMAS | | | 0.02-0.5 | 2-40 | 0-0.1 | 0-15 | 30 |
| | NH3 plasma or N2 plasma | | 2nd film 36 | | | | |
| | | | supply time (sec) | 1st exhaust time (sec) | nitridization time (sec) | 2nd exhaust time (sec) | number of cycles |
| | | | 0.02-0.5 | 2-20 | 0.2-5 | 2-15 | 1800 |

FIG. 8A

| 1st source gas | 2nd source gas | 1st film 34 | | | | |
|---|---|---|---|---|---|---|
| | | supply time (sec) | 1st exhaust time (sec) | nitridization time (sec) | 2nd exhaust time (sec) | number of cycles |
| DMS | NH3 plasma or N2 plasma | 0.01-0.2 | 2-30 | 0-0.1 | 0-15 | 30 |
| | | 2nd film 36 | | | | |
| | | supply time (sec) | 1st exhaust time (sec) | nitridization time (sec) | 2nd exhaust time (sec) | number of cycles |
| | | 0.01-0.2 | 2-15 | 0.2-5 | 2-15 | 1800 |

FIG. 8B

| 1st source gas | 2nd source gas | 1st film 34 | | | | |
|---|---|---|---|---|---|---|
| | | supply time (sec) | 1st exhaust time (sec) | nitridization time (sec) | 2nd exhaust time (sec) | number of cycles |
| BEMAS | NH3 plasma or N2 plasma | 0.03-0.5 | 2-60 | 0-0.1 | 0-15 | 30 |
| | | 2nd film 36 | | | | |
| | | supply time (sec) | 1st exhaust time (sec) | nitridization time (sec) | 2nd exhaust time (sec) | number of cycles |
| | | 0.03-0.5 | 2-30 | 0.2-5 | 2-15 | 30 |

FIG. 9A

| 1st source gas | 2nd source gas | 1st film 34 | | | |
|---|---|---|---|---|---|
| | | supply time (sec) | 1st exhaust time (sec) | nitridization time (sec) | 2nd exhaust time (sec) | number of cycles |
| SiCl4 | | 0.01-0.2 | 2-30 | 0-0.1 | 0-15 | 30 |
| | NH3 plasma or N2 plasma | 2nd film 36 | | | | |
| | | supply time (sec) | 1st exhaust time (sec) | nitridization time (sec) | 2nd exhaust time (sec) | number of cycles |
| | | 0.01-0.2 | 2-15 | 0.2-5 | 2-15 | 1800 |

FIG. 9B

| 1st source gas | 2nd source gas | 1st film 34 | | | |
|---|---|---|---|---|---|
| | | supply time (sec) | 1st exhaust time (sec) | nitridization time (sec) | 2nd exhaust time (sec) | number of cycles |
| Si2Cl6 | | 0.01-0.2 | 2-30 | 0-0.1 | 0-15 | 30 |
| | NH3 plasma or N2 plasma | 2nd film 36 | | | | |
| | | supply time (sec) | 1st exhaust time (sec) | nitridization time (sec) | 2nd exhaust time (sec) | number of cycles |
| | | 0.01-0.2 | 2-15 | 0.2-5 | 2-15 | 1800 |

| source gas | supply time (sec) | 1st exhaust time (sec) | number of cycles |
|---|---|---|---|
| TMA | 0.01-0.2 | 2-30 | 30 |

FIG. 11

| 1st source gas | 2nd source gas | supply time (sec) | 1st exhaust time (sec) | Oxidization time (sec) | 2nd exhaust time (sec) | number of cycles |
|---|---|---|---|---|---|---|
| | | | | 1st film 34 | | |
| BTBAS | O2 plasma | 0.03-0.5 | 2-60 | 0-0.3 | 0-15 | 45 |
| | O3 | 0.03-0.5 | 2-60 | 0-1.5 | 0-15 | 45 |
| | H2O | 0.03-0.5 | 2-60 | 0 | 0 | 45 |
| | Lewis base | 0.03-0.5 | 2-60 | 0 | 0 | 45 |
| 1st source gas | 2nd source gas | supply time (sec) | 1st exhaust time (sec) | Oxidization time (sec) | 2nd exhaust time (sec) | number of cycles |
| | | | | 2nd film 36 | | |
| | O2 plasma | 0.03-0.5 | 2-30 | 0.5-5 | 2-15 | 1800 |
| | O3 | 0.03-0.5 | 2-30 | 2-5 | 2-15 | 1800 |
| | H2O | 0.03-0.5 | 2-30 | 0.1-2 | 2-15 | 1800 |
| | Lewis base | 0.03-0.5 | 2-30 | 0.1-5 | 2-15 | 1800 |

FIG. 12

| 1st source gas | 2nd source gas | supply time (sec) | 1st exhaust time (sec) | Oxidization time (sec) | 2nd exhaust time (sec) | number of cycles |
|---|---|---|---|---|---|---|
| | | | 1st film 34 | | | |
| TDMAS | O2 plasma | 0.02-0.5 | 2-40 | 0-0.3 | 0-15 | 45 |
| | O3 | 0.02-0.5 | 2-40 | 0-1.5 | 0-15 | 45 |
| | H2O | 0.02-0.5 | 2-40 | 0 | 0 | 45 |
| | Lewis base | 0.02-0.5 | 2-40 | 0 | 0 | 45 |
| | 2nd source gas | supply time (sec) | 1st exhaust time (sec) | Oxidization time (sec) | 2nd exhaust time (sec) | number of cycles |
| | | | 2nd film 36 | | | |
| | O2 plasma | 0.02-0.5 | 2-20 | 0.5-5 | 2-15 | 1800 |
| | O3 | 0.02-0.5 | 2-20 | 2-5 | 2-15 | 1800 |
| | H2O | 0.02-0.5 | 2-20 | 0.1-2 | 2-15 | 1800 |
| | Lewis base | 0.02-0.5 | 2-20 | 0.1-5 | 2-15 | 1800 |

FIG. 13

| 1st source gas | 2nd source gas | supply time (sec) | 1st exhaust time (sec) | Oxidization time (sec) | 2nd exhaust time (sec) | number of cycles |
|---|---|---|---|---|---|---|
| | | | | 1st film 34 | | |
| DMS | O2 plasma | 0.01-0.2 | 2-30 | 0-0.3 | 0-15 | 45 |
| | O3 | 0.01-0.2 | 2-30 | 0-1.5 | 0-15 | 45 |
| | H2O | 0.01-0.2 | 2-30 | 0 | 0 | 45 |
| | Lewis base | 0.01-0.2 | 2-30 | 0 | 0 | 45 |
| 1st source gas | 2nd source gas | supply time (sec) | 1st exhaust time (sec) | Oxidization time (sec) | 2nd exhaust time (sec) | number of cycles |
| | | | | 2nd film 36 | | |
| DMS | O2 plasma | 0.01-0.2 | 2-15 | 0.5-5 | 2-15 | 1800 |
| | O3 | 0.01-0.2 | 2-15 | 2-5 | 2-15 | 1800 |
| | H2O | 0.01-0.2 | 2-15 | 0.1-2 | 2-15 | 1800 |
| | Lewis base | 0.01-0.2 | 2-15 | 0.1-5 | 2-15 | 1800 |

FIG. 14

| 1st source gas | 2nd source gas | supply time (sec) | 1st exhaust time (sec) | Oxidization time (sec) | 2nd exhaust time (sec) | number of cycles |
|---|---|---|---|---|---|---|
| | | | | 1st film 34 | | |
| BEMAS | O2 plasma | 0.03-0.5 | 2-60 | 0-0.3 | 0-15 | 45 |
| | O3 | 0.03-0.5 | 2-60 | 0-1.5 | 0-15 | 45 |
| | H2O | 0.03-0.5 | 2-60 | 0 | 0 | 45 |
| | Lewis base | 0.03-0.5 | 2-60 | 0 | 0 | 45 |
| | 2nd source gas | supply time (sec) | 1st exhaust time (sec) | Oxidization time (sec) | 2nd exhaust time (sec) | number of cycles |
| | | | | 2nd film 36 | | |
| | O2 plasma | 0.03-0.5 | 2-30 | 0.5-5 | 2-15 | 1800 |
| | O3 | 0.03-0.5 | 2-30 | 2-5 | 2-15 | 1800 |
| | H2O | 0.03-0.5 | 2-30 | 0.1-2 | 2-15 | 1800 |
| | Lewis base | 0.03-0.5 | 2-30 | 0.1-5 | 2-15 | 1800 |

FIG. 15

| 1st source gas | | | 1st film 34 | | | |
|---|---|---|---|---|---|---|
| | 2nd source gas | supply time (sec) | 1st exhaust time (sec) | Oxidization time (sec) | 2nd exhaust time (sec) | number of cycles |
| SiCl4 | O2 plasma | 0.01-0.2 | 2-30 | 0-0.3 | 0-15 | 45 |
| | O3 | 0.01-0.2 | 2-30 | 0-1.5 | 0-15 | 45 |
| | | | 2nd film 36 | | | |
| | 2nd source gas | supply time (sec) | 1st exhaust time (sec) | Oxidization time (sec) | 2nd exhaust time (sec) | number of cycles |
| | O2 plasma | 0.01-0.2 | 2-15 | 0.5-5 | 2-15 | 1800 |
| | O3 | 0.01-0.2 | 2-15 | 2-5 | 2-15 | 1800 |

FIG. 16

| 1st source gas | 2nd source gas | 1st film 34 | | | | |
|---|---|---|---|---|---|---|
| | | supply time (sec) | 1st exhaust time (sec) | Oxidization time (sec) | 2nd exhaust time (sec) | number of cycles |
| Si2Cl6 | O2 plasma | 0.01-0.2 | 2-30 | 0-0.3 | 0-15 | 45 |
| | O3 | 0.01-0.2 | 2-30 | 0-1.5 | 0-15 | 45 |
| | | 2nd film 36 | | | | |
| | 2nd source gas | supply time (sec) | 1st exhaust time (sec) | Oxidization time (sec) | 2nd exhaust time (sec) | number of cycles |
| | O2 plasma | 0.01-0.2 | 2-15 | 0.5-5 | 2-15 | 1800 |
| | O3 | 0.01-0.2 | 2-15 | 2-5 | 2-15 | 1800 |

FIG. 17

| 1st source gas | 2nd source gas | supply time (sec) | 1st exhaust time (sec) | Oxidization time (sec) | 2nd exhaust time (sec) | number of cycles |
|---|---|---|---|---|---|---|
| | | | | 1st film 34 | | |
| TMA | O2 plasma | 0.01-0.2 | 2-30 | 0-0.3 | 0-15 | 30 |
| | O3 | 0.01-0.2 | 2-30 | 0-1.5 | 0-15 | 30 |
| | H2O | 0.01-0.2 | 2-30 | 0 | 0 | 30 |
| | Lewis base | 0.01-0.2 | 2-30 | 0 | 0 | 30 |
| | 2nd source gas | supply time (sec) | 1st exhaust time (sec) | Oxidization time (sec) | 2nd exhaust time (sec) | number of cycles |
| | | | | 2nd film 36 | | |
| | O2 plasma | 0.01-0.2 | 2-15 | 0.5-5 | 2-15 | 1200 |
| | O3 | 0.01-0.2 | 2-15 | 2-5 | 2-15 | 1200 |
| | H2O | 0.01-0.2 | 2-15 | 0.1-2 | 2-15 | 1200 |
| | Lewis base | 0.01-0.2 | 2-15 | 0.1-5 | 2-15 | 1200 |

FIG. 18

| 1st source gas | 2nd source gas | 1st film 34 | | | | |
|---|---|---|---|---|---|---|
| | | supply time (sec) | 1st exhaust time (sec) | nitridization time (sec) | 2nd exhaust time (sec) | number of cycles |
| TMA | NH3 plasma or N2 plasma | 0.01-0.2 | 2-30 | 0 | 0 | 30 |
| | | 2nd film 36 | | | | |
| | | supply time (sec) | 1st exhaust time (sec) | nitridization time (sec) | 2nd exhaust time (sec) | number of cycles |
| | | 0.01-0.2 | 2-15 | 0.2-5 | 2-15 | 1200 |

METHOD FOR FABRICATING SEMICONDUCTOR DEVICE

CROSS-REFERENCE TO RELATED APPLICATION

This application is a divisional application of U.S. patent application Ser. No. 13/853,742, filed Mar. 29, 2013, which is based upon and claims the benefit of priority of the prior Japanese Patent Application No. 2012-081797 filed on Mar. 30, 2012, the entire contents of which are incorporated herein by reference.

BACKGROUND (i) Technical Field

The present invention relates to a method for fabricating a semiconductor device.

(ii) Related Art

Nitride semiconductors are used in semiconductor devices such as an FET (Field Effect Transistor). In order to protect a nitride semiconductor layer, an insulating layer that covers the nitride semiconductor layer may be provided. For example, Japanese Patent Application Publication No. 2010-166040 discloses an arrangement in which a protection film made of silicon oxide is provided on a nitride semiconductor layer.

Conventionally, the capacitance of the semiconductor device, which may include the intrinsic capacitance and the parasitic capacitance, may change due to an oxide layer formed on the surface of the nitride semiconductor layer. Variation in the capacitance may drift the gain. Further, electrons are captured in electron traps in the insulating film, so that the current of the semiconductor device may change. Conventionally, it is difficult to suppress both variation in the capacitance and that in the current.

SUMMARY

According to an aspect of the present invention, it is possible to suppress both variation in the capacitance and that in the current.

According to another aspect of the present invention, there is provided a method for fabricating a semiconductor device including: forming a first film that contact a surface of the nitride semiconductor layer and have a thickness equal to or larger than 1 nm and equal to or smaller than 5 nm, the first film being made of silicon nitride having a composition ratio of silicon to nitrogen larger than 0.75, silicon oxide having a composition ratio of silicon to oxygen larger than 0.5, or aluminum; and forming a source electrode, a gate electrode and a drain electrode on the nitride semiconductor layer.

BRIEF DESCRIPTION OF THE DRAWINGS

FIGS. 7A and 7B illustrate conditions for growing first and second films formed of silicon nitride;

FIGS. 8A and 8B illustrate conditions for growing first and second films formed of silicon nitride;

FIGS. 9A and 9B illustrate conditions for growing first and second films formed of silicon nitride;

FIG. 11 illustrates conditions for growing first and second films formed of silicon oxide;

FIG. 12 illustrates conditions for growing first and second films formed of silicon oxide;

FIG. 13 illustrates conditions for growing first and second films formed of silicon oxide;

FIG. 14 illustrates conditions for growing first and second films formed of silicon oxide;

FIG. 15 illustrates conditions for growing first and second films formed of silicon oxide;

FIG. 16 illustrates conditions for growing first and second films formed of silicon oxide;

FIG. 17 illustrates conditions for growing a first film of aluminum and a second film of aluminum oxide; and FIG. 18 illustrates conditions for growing a first film of aluminum and a second film of aluminum nitride.

DETAILED DESCRIPTION

Figure 1:
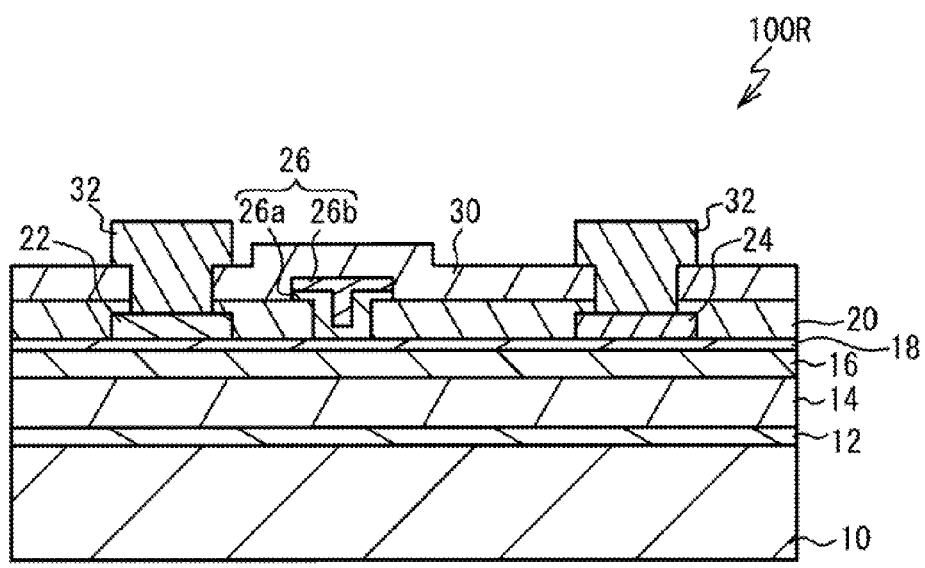
FIG. 1 is a cross-sectional view of a semiconductor device in accordance with a comparative example.

First, a comparative example is described. FIG. 1 is a cross-sectional view of a semiconductor device 100R in accordance with a comparative example.

Referring to FIG. 1, the semiconductor device 100R includes a substrate 10, a barrier layer 12, a channel layer 14, an electron supply layer 16, a cap layer 18, an insulating film 20, a source electrode 22, a drain electrode 24, a gate electrode 26, and interlayer insulating films 30 and interconnection lines 32.

The barrier layer 12 contacts the upper surface of the substrate 10, and the channel layer 14 contacts the upper surface of the barrier layer 12. The electron supply layer 16 contacts the upper layer of the channel layer 14, and the cap layer 18 contacts the upper surface of the electron supply layer 16. The insulating film 20 contacts the upper surface of the cap layer 18. The source electrode 22, the drain electrode 24 and the gate electrode 26 are formed in openings in the insulating film 20, and contact the upper surface of the cap layer 18. The interlayer insulating film 30 contacts the upper layers of the insulating film 20 and the gate electrode 26. Interconnection lines 32 are formed in openings in the interlayer insulating film 30, and contact the upper surface of the source electrode 22 or that of the drain electrode 24.

The substrate 10 is formed of, for example, silicon carbide (SiC) or sapphire. The semiconductor layers (the barrier layer 12, channel layer 14, electron supply layer 16 and cap layer 18) are nitride semiconductor layers. The barrier layer 12 is made of, for example, aluminum nitride (AlN). The channel layer 14 and the cap layer 18 are made of, for example, gallium nitride (GaN). The electron supply layer 16 is made of, for example, aluminum gallium nitride (AlGaN). The insulating film 20 and the interlayer insulating film 30 are made of, for example, silicon nitride (SiN). The source electrode 22 and the drain electrode 24 are made of a metal, each of which may be composed of, for example, a titanium (Ti) layer and an aluminum (Al) layer stacked in this order from the cap layer 18. The gate electrode 26 is made of a metal and may be composed of a nickel (Ni) layer 26a and a gold (Au) layer 26b stacked in this order from the cap layer 18. When the drain electrode 24 is set at a positive potential and the gate electrode 26 is set at a negative potential with the source electrode 22 being grounded, a two-dimensional electron gas (2DEG) is generated in the channel layer 14. And electrons in 2DEG move between the source and the drain.

Figure 2A:
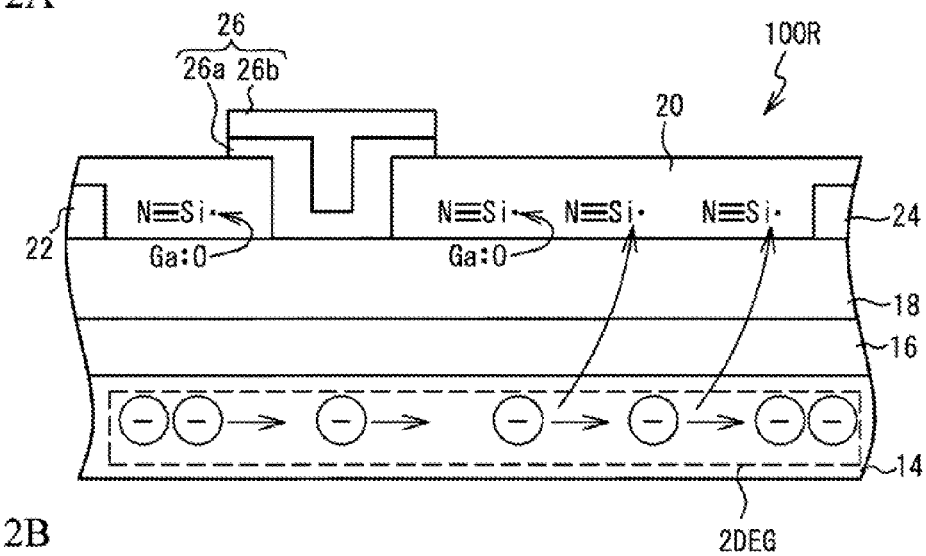
FIG. 2A is a schematic view that illustrates an example in which an insulating film (silicon nitride) has a large Si composition ratio.

A description is now given of a problem that occurs in the comparative example. FIG. 2A is a schematic view that illustrates an example in which the insulating film has a large Si composition ratio. In FIG. 2A, a portion in the vicinity of the gate electrode 26 is enlarged and hatching is omitted.

Referring to FIG. 2A, a denatured layer including gallium oxide (Ga:O in FIG. 2A) is formed on the upper surface of the cap layer 18, and dots show electrons. In order to remove the denatured layer, the composition ratio of Si to N (nitrogen) in the insulating film 20 is made larger than a Si/N ratio of 0.75 of silicon nitride ($Si_3N_4$) having the stoichiometric composition. Silicon in the insulating film 20 has an anti-bonding orbital (the dot on the right side of each Si in FIG. 2A) in which Si is not bonded to N, and many silicon-hydrogen (Si—H) bonds are formed. As depicted by arrows in FIG. 2A, the denatured layer is removed in such a manner that oxygen ions (O ions) in the cap layer 18 are bonded to the anti-bonding orbitals of Si in the insulating film 20. However, Si in the insulating films functions as an electron trap, and traps an electron in 2DEG.

Figure 2B:
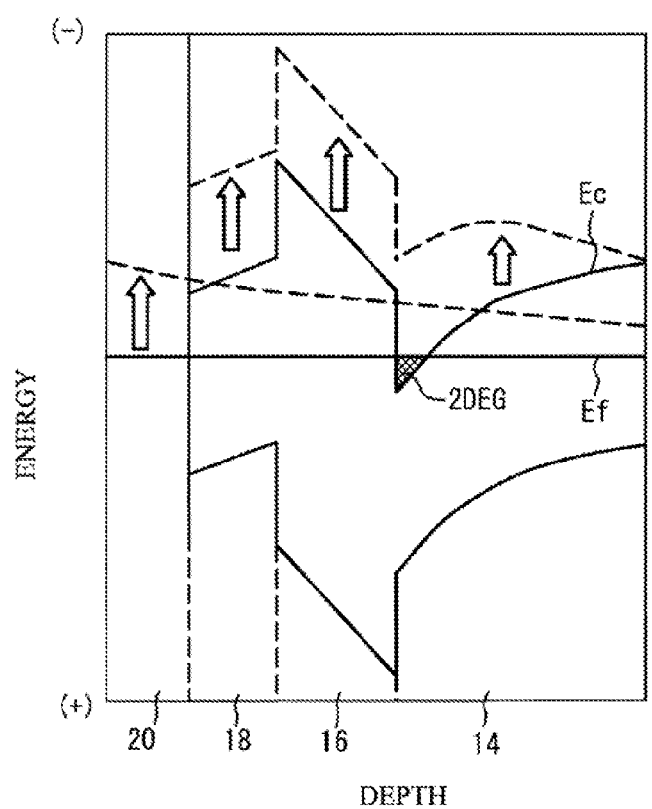
FIG. 2B is a band diagram of the example.

FIG. 2B is a schematic diagram that illustrates an exemplary band diagram. The horizontal axis denotes the depth of the semiconductor device 100R, and the vertical axis denotes energy. A reference Ef is the Fermi energy, Ec is the energy of the bottom of the conduction band, and Ev is the energy of the top of the valence band. Solid lines denote energy before the electrons are trapped, and broken lines denote energy after the electrons are trapped. As indicated by arrows in FIG. 2B, the electrons in 2DEG are captured in the electron traps in the insulating film 20, and the energy band of the insulating film 20 shifts to the minus side. Accordingly, the energy bands of the channel layer 14, the electron supply layer 16 and the cap layers 18 shift to the minus side. Since the energy Ec of the conduction band of the channel layer 14 shifts to the minus side, the number of electrons in 2DEG decreases. Thus, the saturation current of the semiconductor device 100R decreases.

Figure 3:
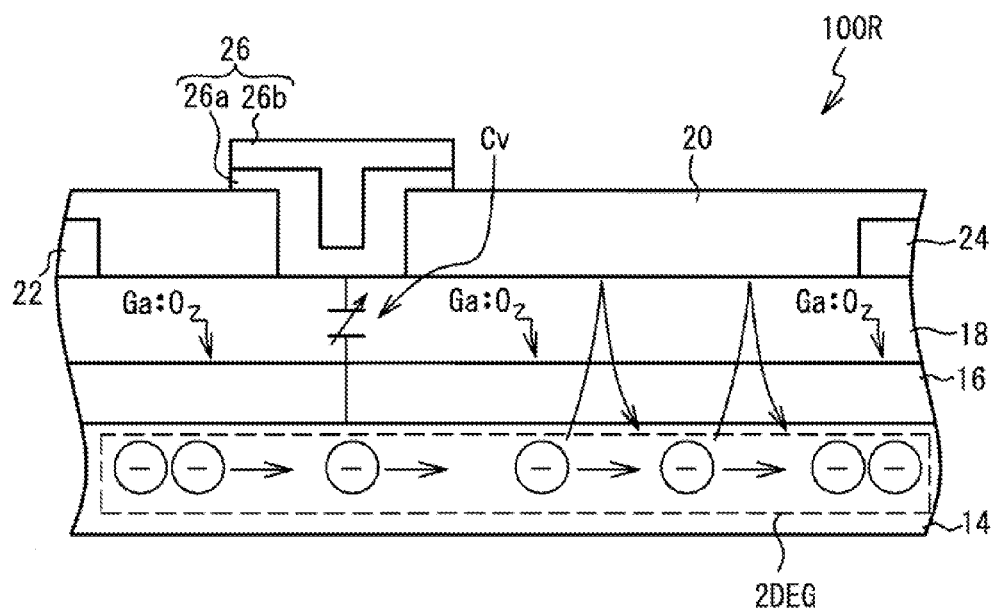
FIG. 3 is a schematic diagram of an exemplary structure in which an insulating film has a stoichiometric composition.

Next, a description is given of an exemplary structure in which the insulating film 20 has a stoichiometric composition ($Si_3N_4$). FIG. 3 is a schematic diagram of such an exemplary structure. As illustrated in FIG. 3, since the Si/N ratio is 0.75, the Si atoms in the insulating film 20 do not have anti-bonding orbitals. Thus, the Si atoms have a difficulty in trapping the electrons in 2DEG. Since the trapping of electrons is limited, the shift of the energy band is limited. However, Si in the insulating film 20 has a difficulty in bonding with O ions. Thus, Ga:O in the cap layer 18 remains. As illustrated by arrows, O ions move due to the application of voltages to the source electrode 22, the drain electrode 24 and the gate electrode 26 or temperature variation. The above movement of O ions varies the capacitance of the semiconductor device 100R, which may be the gate-source capacitance or the gate-drain capacitance. For example, a variable capacitance Cv is formed between the gate electrode 26 and the channel layer 14 is generated, and varies. This variation causes a drift in the gain of the semiconductor device 100R. Such a gain drift may occur even in a case where the composition of the insulating film 20 is not stoichiometric strictly, but is close to the stoichiometric composition. As described above, the comparative example has difficulty in suppressing both the capacitance variation and the current variation.

First Embodiment

Figure 4A:
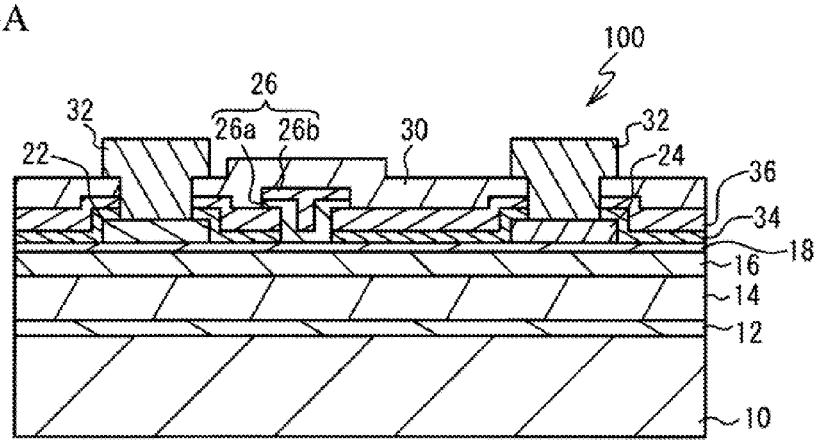
FIG. 4A is a cross-sectional view of a semiconductor device in accordance with a first embodiment.

A first embodiment has an exemplary structure having a film having a comparatively high composition ratio of Si to N, and a stoichiometric film provided on the large composition film. FIG. 4A is a cross-sectional view of a semiconductor device in accordance with the first embodiment.

Referring to FIG. 4A, the semiconductor device 100 is configured to have a first film 34 provided on the cap layer 18 and a second film 36 provided on the first film 34. The first film 34 contacts the upper surface of the cap layer 18. The second film 36 contacts the upper surface of the first film 34. The first film 34 and the second film 36 may be made of SiN. The Si/N ratio of the first film 34 is larger than 0.75. The second film 36 has the stoichiometric composition. The first film 34 has an exemplary thickness that is equal to or larger than 1 nm and is equal to or smaller than 5 nm. The second film 36 has an exemplary thickness that is equal to or larger than 20 nm and is equal to or smaller than 100 nm.

Figure 4B:
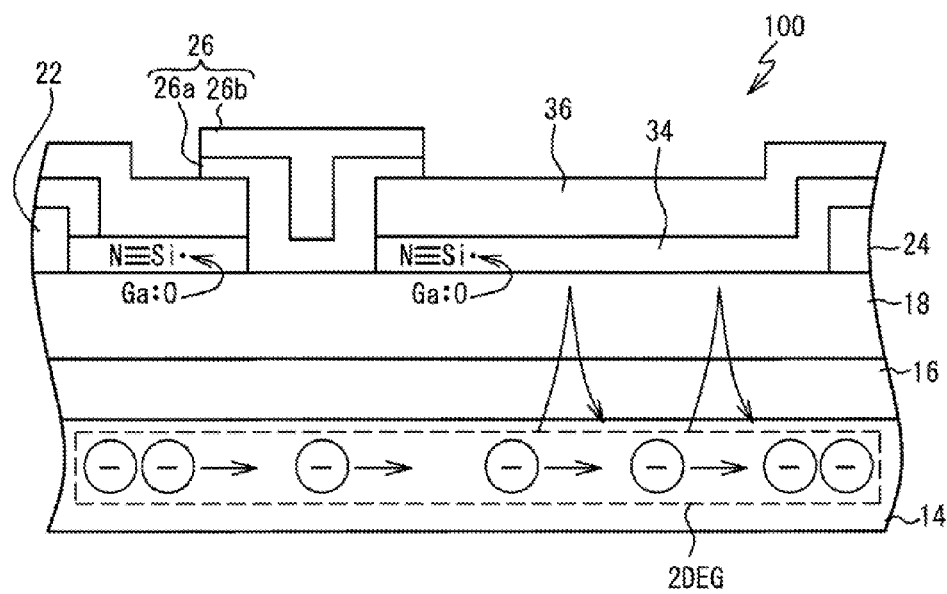
FIG. 4B is a diagram that schematically illustrates an enlarged view of a gate electrode and its vicinity.

FIG. 4B is a diagram that schematically illustrates an enlarged view of the gate electrode 26 and its vicinity. Since the Si/N ratio of the first film 34 is larger than 0.75, Si atoms in the first film 34 have anti-bonding orbitals. The anti-bonding orbitals of Si and the O ions in the cap layer 18 are bonded, so that the denatured layer is removed. Thus, it is possible to suppress variation in the capacitance of the semiconductor device 100 due to the movement of the O ions. Since the second film 36 has the stoichiometric composition, the electron traps are hard to be formed in the second film 36. Thus, the trapping of the electrons in 2DEG is suppressed and variation in the saturation current is also suppressed. As described above, the use of stacked layers having different Si composition ratios realize the suppression of both the current variation and the capacitance variation.

Table 1 shows the standard Gibbs energies of formation of some substances (hereinafter simply referred to as Gibbs energy).

TABLE 1

| Substance | $In_2O_3$ | $Ga_2O_3$ | $Al_2O_3$ | $SiO_2$ |
|---|---|---|---|---|
| Gibbs energy (kJ/mol) | −419.4 | −499 | −791 | −857 |

As shown in Table 1, the Gibbs energy decreases in the order of indium oxide ($In_2O_3$), gallium oxide ($Ga_2O_3$), aluminum oxide ($Al_2O_3$) and silicon oxide ($SiO_2$). As the Gibbs energy is lower, the substance is more stable. The Gibbs energy of $Ga_2O_3$ formed in the denatured layer is −499 kJ/mol. As illustrated in FIG. 4B, the Si atoms in the first film 34 are bonded to the O ions, and $SiO_2$ is thus generated. The Gibbs energy of $SiO_2$ is −857 kJ/mol, and is lower than the Gibbs energy of $Ga_2O_3$. Since the first film 34 and the cap layer 18 contact each other, the reaction of the Si atoms and the O ions proceeds spontaneously, and the denatured layer is effectively removed. In an exemplary case where the cap layer 18 includes indium (In), the denatured layer includes $In_2O_3$. Since the Gibbs energy of $SiO_2$ is lower than that of $In_2O_3$, the denatured layer is effectively removed. A case of Al and $Al_2O_3$ will be described later.

A description is now given of a fabrication method of the semiconductor device 100. FIGS. 5A through 5C and FIGS. 6A through 6C are cross-sectional views that illustrate an exemplary method for fabricating the semiconductor device 100.

Figure 5A:
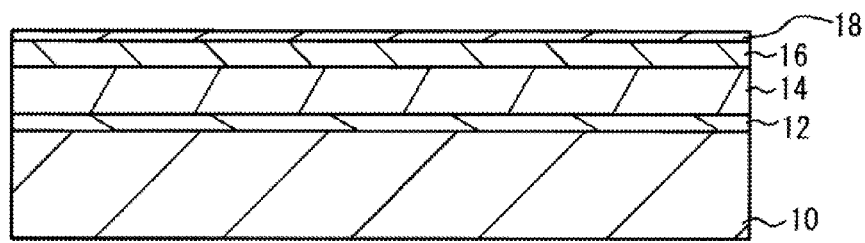
FIGS. 5A through 5C are cross-sectional views of an exemplary method for fabricating a semiconductor device.
Figure 5B:
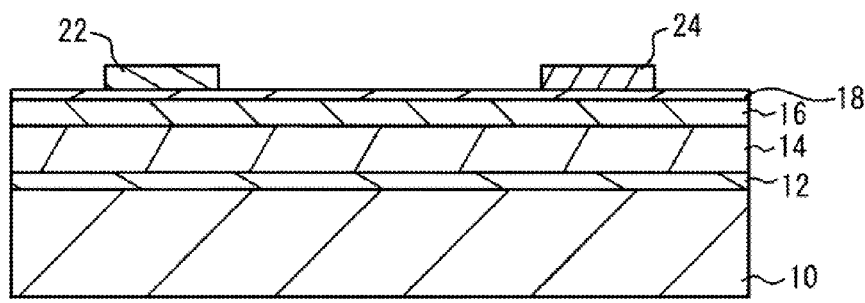
Figure 5C:
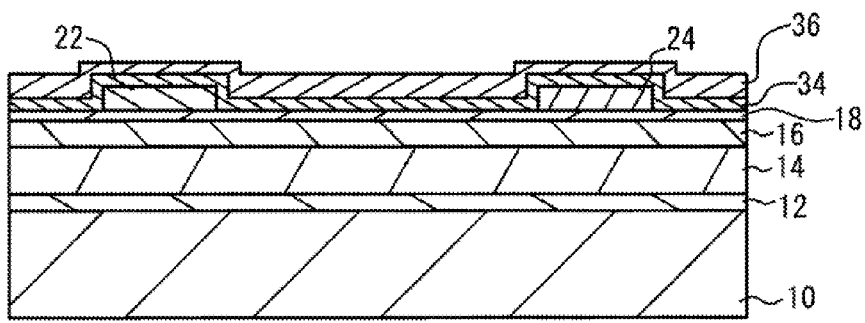

Referring to FIG. 5A, the barrier layer 12, the channel layer 14, the electron supply layer 16 and the cap layer 18 are grown by, for example, MOCVD (Metal Oxide Chemical Vapor Deposition). Referring to FIG. 5B, the source electrode 22 and the drain electrode 24 are provided on the cap layer 18 by, for example, an evaporation process and a liftoff process. Referring to FIG. 5C, the first film 34 and the second film 36 are provided by, an ALD (Atomic Layer Deposition) method.

Figure 6A:
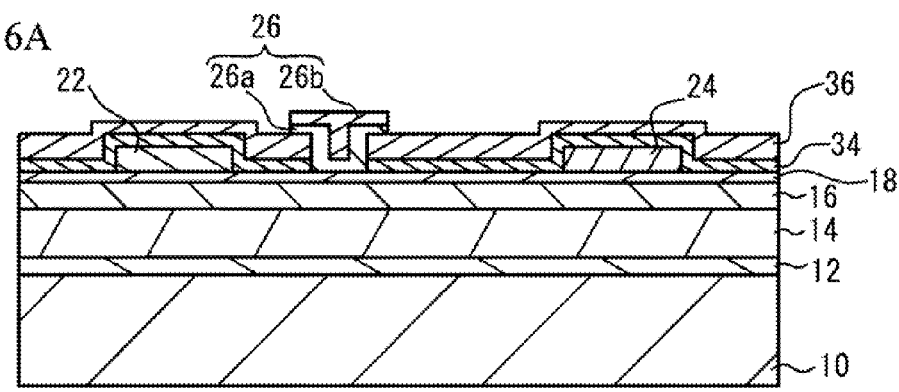
FIGS. 6A through 6C are cross-sectional views of steps of the method that follow the steps of FIGS. 5A through 5C.
Figure 6B:
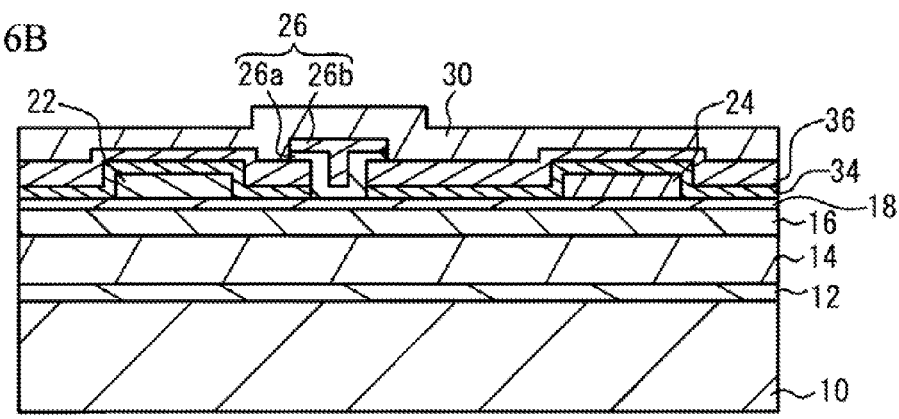
Figure 6C:
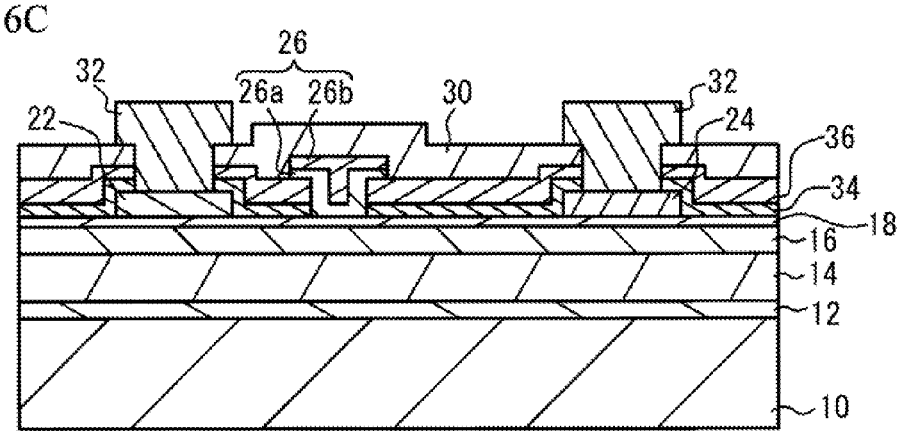

Referring to FIG. 6A, an opening is formed in the first film 34 and the second film 36, and the gate electrode 26 is provided in the opening by sputtering, for example. Referring to FIG. 6B, the interlayer insulating film 30 is formed on the gate electrode 26, the first film 34 and the second film 36. Referring to FIG. 6C, openings are formed in the interlayer insulating film 30, and the interconnection lines 32 are provided in the openings by plating. The structure of the semiconductor device 100 illustrated in FIG. 6C is complete.

A description is now given of conditions for growing the first film 34 and the second films 36. The ALD method forms films as follows. A first source gas is supplied in an ALD apparatus, and a single-atom-thick layer of Si is formed. Then, the first source gas is exhausted from the ALD apparatus. A second source gas is supplied to the ALD apparatus, and the Si layer is converted into nitride. Then, the second source gas is exhausted from the ALD apparatus. A supply time is defined as the time during which the first source gas is supplied. A first exhaust time is defined as the time during which the first source gas is exhausted. The nitridization time is defined as the time during which the second source gas is supplied. A second exhaust time is defined as the time during which the second source gas is exhausted. One cycle is defined as the time from the initiation of supply of the first source gas to the completion of exhaust of the second source gas.

FIGS. 7A, 7B, 8A, 8B, 9A and 9B are diagrams that show exemplary conditions for growing the first film 34 and the second film 36 made of SiN. In the conditions for growing the films shown in FIGS. 7A through 9B, the first source gas includes BTBAS (Bis(tertiary-butyl-amino)silane: $CH_4H_9NH_2)SiH_2$), TDMAS (Tris(dimethylamino)silane: $SiH(N(CH_3)_2)_3$), DMS (dimethyl silane: $(CH_3)_2SiH_2$), BEMAS (Bis(ethyl-methyl-amino)silane: $CH_3(C_2H_5)N)_2SiH_2$), $SiCl_4$ and $Si_2Cl_5$, respectively. The second source gas is common to the conditions shown in FIGS. 7A through 9B, and includes ammonia ($NH_3$) plasma or $N_2$ plasma. As described above, the first film 34 and the second film 36 may be grown by aminosilane (general expression: $(R1R2N)_nSiH_{4-n}$).

By changing the first supply time and the second supply time, it is possible to grow, from the same source gas, the first film 34 and the second film 36 having different compositions. The number of cycles may be changed in accordance with the thickness of the first film 34 and that of the second film 36. The film growing temperature (the temperature in the ALD apparatus) may be equal to or higher than 200° C. and may be equal to or lower than 400° C., for example. Any of the film growing conditions illustrated in FIGS. 7A through 9B may be used or yet another condition may be used.

A description is now given of the reason why the first film 34 is formed by the ALD method. When the first film 34 is too thick, many electron traps are formed since a large number of Si atoms having anti-bonding orbitals exists in the first film 34. Thus, electros in 2DEG may be captured in the electron traps. In contrast, when the first film 34 is too thin, the removal of the denatured layer has a difficulty because a small number of Si atoms having anti-bonding orbitals exists. In order to suppress the trapping of electrons and remove the denatured layer, the thickness of the first film 34 has a thickness equal to or larger than 1 nm and equal to or smaller than 5 nm, and may be not smaller than 1.5 nm or 2 nm and may be not larger than 4.5 nm or 4 nm. As described above, the first film 34 is required to be reliably formed so that the first film 34 is thin and is even or almost even in thickness. This requirement may be preferably achieved by the ALD method. Although the first film 34 may be formed by plasma CVD, there is a difficulty in reliably forming a film thickness of not larger than 5 nm, which corresponds to a three- or four-atom-thick layer and in removing the denatured layer efficiently, as compared with the ALD method. Another method besides the ALD method may be used as long as the first film 34 is formed so as to be thin and even or almost even in thickness. The composition ratio of Si to N in the first film 34 is larger than 0.75, and may be 0.78, 0.8, 0.85 or 0.9.

The second film 36 may be formed to have the substantive stoichiometric composition. The substantive stoichiometric composition includes not only the strict stoichiometric composition but also a composition including an impurity having a difficulty in removal in the fabrication process. For example, the second film 36 may be formed by sputtering. However, in order to make the composition of the second film 36 closer to the stoichiometric value, the second film 36 is preferably formed by the ALD method. The second film 36 is preferably equal to or larger than 20 nm and is equal to or smaller than 100 nm in order to make it difficult for the electron traps to be formed and to protect the semiconductor layer from moisture. For example, the thickness of the second film 36 may be not smaller than 25 nm or 30 nm and not larger than 95 nm or 90 nm.

The second film 36 has the following effects other than those described above. In a case where the gate electrode 26 is formed in an opening in the first film on the cap layer 18, a parasitic capacitance between the gate electrode 26 and the cap layer 18 is concerned because the first film 34 is thin. With the above in mind, the gate electrode 26 is formed in the opening in the first film 34 and the second film 36 on the cap layer 18 in order to increase the distance between the gate electrode 26 and the cap layer 18 and to reduce the parasitic capacitance. However, it is not essential to form the second film 36 on the first film 34, but the second film 36 may be omitted.

Second Embodiment

Figures 10A, 10B:
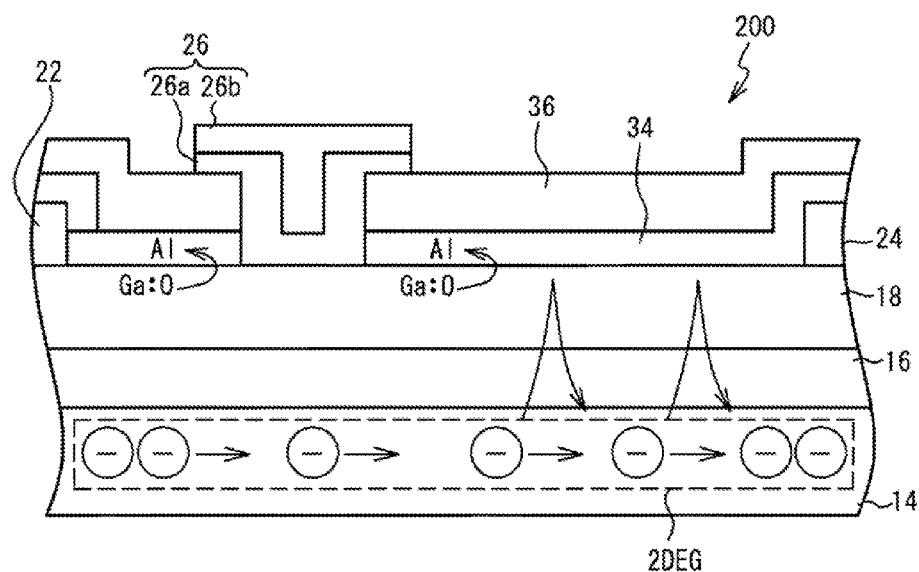
FIG. 10A is a schematic diagram of an enlarged view of a gate electrode of a semiconductor device in accordance with a second embodiment.
FIG. 10B illustrates conditions for growing a first film of aluminum.

A second embodiment has an exemplary structure in which the first film 34 is made of Al. A cross-sectional view of a semiconductor device 200 in accordance with the second embodiment is the same as that of the semiconductor device 100. FIG. 10A is a schematic diagram illustrating an enlarged view of the gate electrode 26 of the semiconductor device 200 and its vicinity.

Referring to FIG. 10A, the Al atoms in the first film 34 are bonded to the O ions in the cap layer 18. Thus, as in the case of the first embodiment, the denatured layer is removed and the trapping of electros is suppressed. The thickness of the first film 34 may be equal to that used in the first embodiment. The semiconductor device 200 may be fabricated as follows. An illustration of the fabrication method of the semiconductor device 200 is omitted, and FIGS. 4A through 5C are referenced.

As illustrated in FIG. 4B, the first film 34 is formed on the cap layer 18 by the ALD method. The second film 36 is formed by the ALD method. The step of forming the first film 34 and the step of forming the second film 36 are successively carried out. For example, the same ALD apparatus may be used to form the first film 34 and the second film 36. Also, after the first film 34 is formed, the second film 36 is formed without the first film 34 being exposed to atmosphere. The other steps are the same as those of the first embodiment.

FIG. 10B illustrates conditions for growing the first film 34 of Al. As illustrated in FIG. 10B, the source gas includes TMA (trimethylaluminum), for example.

Al is likely to be oxidized. When the substrate 10 on which the first film 34 has been form is removed from the ALD apparatus and is exposed to atmosphere, an oxide film is formed on the surface of the first film 34. In order to prevent the oxide film from being formed, it is preferable that the step of forming the first film 34 and that of forming the second film 36 are successively carried out. Since the first film 34 is formed by the ALD apparatus, the first film 34 is thin and even in thickness. Thus, the denatured layer is effectively removed.

The Al atoms and O ions are bonded to generate $Al_2O_3$. As previously shown in Table 1, the Gibbs energy of $Al_2O_3$ is −791 kJ/mol, and is lower than that of $Ga_2O_3$. Thus, the reaction of the Al atoms and the O ions proceeds, and the denatured layer is effectively removed. Since the Gibbs energy of $Al_2O_3$ is lower than that of $In_2O_3$, the denatured layer is effectively removed even in an exemplary case where the gap layer 18 includes In. Since the Gibbs energy of $Al_2O_3$ is higher than that of $SiO_2$, Al is hard to be bonded to the O ions as compared with Si. Therefore, Al is solely arranged to contact the cap layer 18 like the first film 34, so that the bonding of the Al atoms and the O ions can proceed and the denatured layer can be removed.

In the first and second embodiments, the second film 36 may be formed of an insulative substance having a stoichiometric composition other than $Si_3N_4$. The second film 36 may include at least one of $SiO_2$, $Al_2O_3$ and AlN, for example. The first film 34 may be formed of a substance other than SiN and Al, and the second film 36 may be formed of a substance other than $Si_3N_4$.

An exemplary case using silicon oxide is now described. The composition of the second film 36 is a stoichiometric composition (for example, $SiO_2$). The composition ratio of Si to O in the second film 36 is 0.5. The Si/O ratio in the first film 34 is larger than 0.5. As shown in Table 1, the Gibbs energy of $SiO_2$ is low. Thus, the arrangement of the first film 34 and the cap layer 18 which contact each other facilitates the bonding of the Si atoms and the O ions in the first film 34. Therefore, the denatured layer is removal.

FIGS. 11 through 16 illustrate conditions for growing the first film 34 formed by silicon oxide (for example, Si-rich $Si_2O_3$) and the second film 36 formed by silicon oxide. The first source gases used in the conditions for growing the films in FIGS. 11 through 14 include BTBAS, TDMAS, DMS and BEMAS, respectively, and the second source gases include oxygen ($O_2$), plasma, ozone ($O_3$), water ($H_2O$) and a Lewis base. The Lewis base is a complex of the $H_2O$ coordination of pyridine ($C_5H_5N$). In the conditions illustrated in FIG. 15, the first source gas includes $SiCl_4$, and the second source gas $O_2$ plasma or $O_3$. In the conditions in FIG. 16, the first source gas includes $Si_2Cl_6$, and the second source gas includes $O_2$ plasma or $O_3$. As shown in FIGS. 11 through 16, it is preferable that the oxidization time is changed in accordance with the type of the second source gas.

Another exemplary case using aluminum oxide is now described. The composition of the second film 36 has the stoichiometric composition ($Al_2O_3$). The composition ratio of Al to O in the second film 36 is 0.67.

FIG. 17 shows conditions for growing the first film 34 of aluminum and the second film 36 of aluminum oxide. As shown in FIG. 17, the first source gas includes TMA, and the second source gas includes $O_2$ plasma, $O_3$, $H_2O$ or Lewis base.

Yet another exemplary case is now described. The second film 36 has the stoichiometric composition (AlN). The composition ratio of Al to N in the second film 36 is 1.

FIG. 18 shows conditions for growing the first film 34 of aluminum and the second film 36 of aluminum nitride. As shown in FIG. 18, the first source gas includes TMA, and the second source gas includes $NH_3$ plasma or $N_2$ plasma. The film growing conditions in FIGS. 11 through 18 include conditions for temperature that range from 200° C. to 400° C., for example.

The barrier layer 12, the channel layer 14, the electron supply layer 16 and the cap layer 18 may be made of nitride semiconductors other than the above-described semiconductors. The nitride semiconductors are semiconductors including N, and may be indium gallium nitride (InGaN), indium nitride (InN) and aluminum indium gallium nitride (AlInGaN) other than the above-described semiconductors.

The present invention is not limited to the specifically described embodiments, but may include other embodiments and variations without departing from the scope of the present invention.

What is claimed is:

1. A method for fabricating a semiconductor device comprising:
    forming a first film that contacts with a surface of a nitride semiconductor layer by an atomic layer deposition method, the first film being made of silicon nitride having a composition ratio of silicon to nitrogen larger than 0.75, silicon oxide having a composition ratio of silicon to oxygen larger than 0.5, or aluminum, the first film having a first surface and a second surface that is opposite to the first surface, the first surface contacting the surface of the nitride semiconductor layer;
    forming a source electrode, a gate electrode and a drain electrode on the nitride semiconductor layer; and
    forming a second film on the second surface of the first film by the atomic layer deposition method, the second film comprising a material selected from a group consisting of silicon nitride, silicon oxide, aluminum oxide or aluminum nitride.

2. The method according to claim 1, wherein the first film has a thickness that is equal to or larger than 1 nm and equal to or smaller than 5 nm.

3. The method according to claim 1, wherein the second film has a thickness equal to or larger than 20 nm and equal to or smaller than 100 nm.

4. The method according to claim 1, wherein the first film has a thickness that is equal to or larger than 1 nm and equal to or smaller than 5 nm, and the second film has a thickness equal to or larger than 20 nm and equal to or smaller than 100 nm.

5. The method according to claim 1, wherein the second film is substantially a stoichiometric composition.

6. The method according to claim 1, wherein the second film is formed in contact with the second surface of the first film.

7. The method according to claim 1, wherein the second film is substantially a stoichiometric composition, and the second film is formed in contact with the second surface of the first film.

8. The method according to claim 1, wherein a film growing temperature of the first film and the second film is equal to or higher than 200° C. and equal to or lower than 400° C.

9. The method according to claim 1, wherein forming the first film and forming the second film are performed in-situ.

10. The method according to claim 1, wherein the first film is silicon nitride, and the second film is composed of silicon nitride having a silicon composition smaller than the first film.

11. The method according to claim 1, wherein the first film is composed of aluminum, and the method comprises forming a second film on the first film, a formation of the second film is performed in-situ after a formation of the first film.

12. The method according to claim 11, wherein the formation of the first and second film is performed under an atomic layer deposition apparatus.

13. The method according to claim 1, wherein the first film is formed between the source electrode and the gate electrode, and is between the gate electrode and the drain electrode.

14. The method according to claim 1, wherein the first film is composed of silicon nitride, and the composition ratio of silicon to nitrogen of first film is larger than 0.8.

15. The method according to claim 1, wherein the first film is composed of silicon nitride, and the composition ratio of silicon to nitrogen of first film is larger than 0.85.

16. The method according to claim 1, wherein the first film is composed of silicon nitride, and the composition ratio of silicon to nitrogen of first film is larger than 0.9.

* * * * *